United States Patent
Ho et al.

(10) Patent No.: US 8,954,900 B1
(45) Date of Patent: Feb. 10, 2015

(54) MULTI-PATTERNING MASK DECOMPOSITION METHOD AND SYSTEM

(71) Applicant: Taiwan Semiconductor Manufacturing Co., Ltd., Hsin-Chu (TW)

(72) Inventors: Chia-Ming Ho, Hsinchu (TW); Kun-Ting Tsai, Hsinchu (TW); Tsung-Han Wu, Hsinchu (TW); Ke-Ying Su, Taipei (TW); Hsien-Hsin Sean Lee, Duluth, GA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/955,313

(22) Filed: Jul. 31, 2013

(51) Int. Cl.
*G06F 17/50* (2006.01)

(52) U.S. Cl.
CPC ...................................... *G06F 17/50* (2013.01)
USPC .................. 716/54; 716/51; 716/52; 716/55; 716/56; 430/5; 430/30

(58) Field of Classification Search
CPC . G06F 17/50; G06F 17/5077; G06F 17/5081; G06F 17/5068; G06F 2217/12; G03F 1/70; G03F 7/70433; G03F 7/70466; G03F 7/0035
USPC ...................................... 716/50–56; 430/5, 30
See application file for complete search history.

(56) References Cited

U.S. PATENT DOCUMENTS

| | | | |
|---|---|---|---|
| 8,473,874 B1 * | 6/2013 | Sharma et al. | 716/52 |
| 8,647,893 B1 * | 2/2014 | Agarwal et al. | 438/16 |
| 8,671,368 B1 * | 3/2014 | Salowe et al. | 716/55 |
| 8,689,151 B1 * | 4/2014 | Agarwal et al. | 716/55 |
| 2011/0113393 A1 * | 5/2011 | Sezginer | 716/106 |
| 2011/0119648 A1 * | 5/2011 | Chen et al. | 716/126 |
| 2012/0054696 A1 * | 3/2012 | Su et al. | 716/55 |
| 2013/0024822 A1 * | 1/2013 | Hsieh et al. | 716/52 |
| 2013/0191793 A1 * | 7/2013 | Cao et al. | 716/52 |
| 2014/0038085 A1 * | 2/2014 | Chern et al. | 430/5 |

OTHER PUBLICATIONS

A New Graph-Theoretic, Multi-Objective Layout Decomposition Framnework for Double Patterning Lithography, Jae-Seok Yang, Katrina Lu, Minsik Cho, Kun Yuan, and David Z. Pan, @ 2010 IEEE.*

* cited by examiner

*Primary Examiner* — Nha Nguyen

(74) *Attorney, Agent, or Firm* — Duane Morris LLP; Steven E. Koffs

(57) ABSTRACT

A portion of a layout of a single layer of an integrated circuit is to be multi-patterned. The patterns are divided into first and second groups, to be patterned on the single layer by a first mask or a second mask. For each portion of each pattern, a spacing relationship is determined between that portion and any adjacent pattern on either or both sides. A processor computes a first capacitance (C), resistance (R), or resistance-capacitance (RC) cost of assigning the first group to the first mask and the second group to the second mask, and a second cost of assigning the first group to the second mask and the second group to the first mask, based on the spacing relationships. The first group is assigned to the first mask and the second group to the second mask if the first cost is lower than the second cost.

20 Claims, 8 Drawing Sheets

MULTI-PATTERNING MASK DECOMPOSITION METHOD AND SYSTEM

FIELD

This disclosure relates to semiconductor fabrication generally, and more specifically to electronic design automation tools.

BACKGROUND

In semiconductor integrated circuit (IC) fabrication processes, the resolution of a photoresist pattern begins to blur at about 45 nanometer (nm) half pitch. To continue to use fabrication equipment purchased for larger technology nodes, multi-exposure methods have been developed.

Multiple exposure or multi-patterning technology (MPT) involves forming patterns on a single layer over a substrate using two or more different masks in succession. As long as the patterns within each individual mask comply with the relevant minimum separation distances for the technology node, the combination of patterns formed using the plural masks may include smaller spacings than the minimum separation distance design rule. Thus, MPT provides flexibility and generally allows for significant reduction in overall IC layout.

MPT is a layout splitting method analogous to an M-coloring problem for layout splitting in graph theory, where M is the number of masks used to expose a single layer (and the number of exposures). For example, if two masks are to be used (double patterning technology, DPT), it is customary to refer to the patterns as being assigned one of two "color types", where the color corresponds to a photomask assignment. As used herein, DPT is an example of MPT, so that generic references to MPT include DPT as one non-limiting example.

Some multi-patterning methods, such as the litho-etch-litho-etch (LELE) method use plural reticles in succession for patterning a single layer. Other multi-patterning methods, such as the self-aligned double patterning (SADP) method, use one reticle as a first mask to pattern a resist, and then form spacers adjacent those patterns, and use the spacers as a hard mask for further etching.

DETAILED DESCRIPTION

Figure 1A:
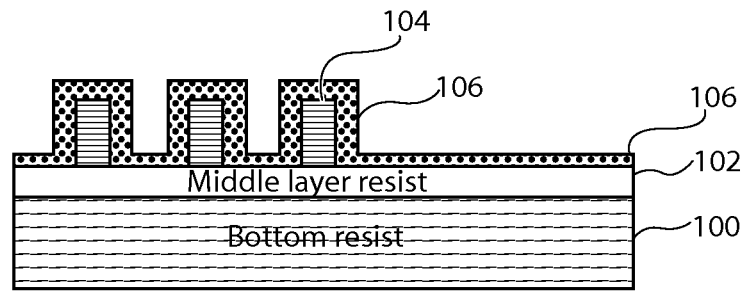
FIGS. 1A-1F are cross-sectional diagrams showing various steps in a Multiple-Patterning-Multiple-Spacer (MPMS) process.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Several multi-patterning methods, such as Self-Aligned Double Patterning (SADP), Multiple-Patterning-Multiple-Spacer (MPMS), Self-Aligned-Litho-Etch (SALE), LELE and Litho-Etch-Litho-Etch-Litho-Etch (LELELE) can use different process steps to form and/or pattern a substrate with two masks.

As used herein, the term "first mask" or "mask A" refers to a photomask (reticle) used in a photolithography process to expose a photoresist in a single layer over the substrate; the term "second mask" or "mask B" can refer to either a second photomask or hard mask formed by spacers over a substrate to pattern a separate set of polygons (circuit patterns, such as conductive lines) in the same layer over the substrate. The second mask is used to pattern a second group of lines (or other polygons) by a process that can be different from the process used to pattern a first group of lines using the first mask.

In one non-limiting example of an LELE process, the second mask is a photomask used for a second exposure step in the same layer of photoresist. In another non-limiting example of an SADP process, after the first exposure and etching step, a conformal layer is formed over the first patterns, and planarized to form sidewall spacers. The side wall spacers constitute the second mask.

In a multi-patterning method where (the second group of) lines are patterned by the second mask using a different process than the process used to pattern the (first group of) lines using the first mask, the second group of lines can have a different width bias than the first group of lines. For example, the first group of lines may have a nominal width and nominal spacing, but the second group of lines can have a larger than nominal width.

FIGS. 1A-1F show a non-limiting example of a Multiple-Patterning-Multiple-Spacer (MPMS) process, for which the routing and mask assignment methods described below are suitable. This is an advanced example of a process in which the second mask is to be formed by spacers in the layer of the substrate, the spacers to be formed on side walls of lines to be patterned by the first mask. (This particular example also uses a second photomask, in addition to the first mask).

In FIG. 1A, a substrate having a bottom resist layer 100, and a middle resist layer 102 is provided. A top layer of photoresist 104 has been patterned using a first photomask, and etched to form a set of sacrificial resist lines (mandrels) 104. A conformal spacer layer 106, such as an oxide or nitride layer is deposited over the mandrels 104 (for example using atomic layer deposition, ALD).

Figure 1B:
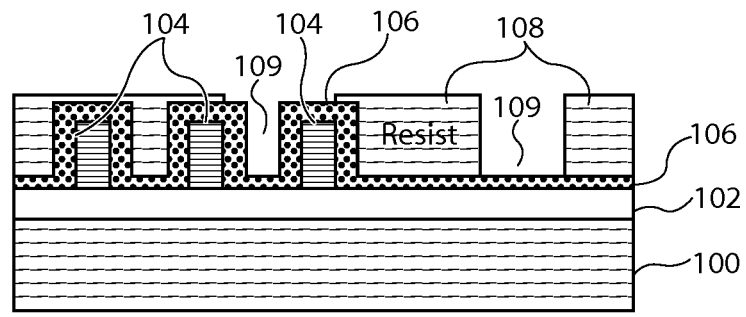

Another layer of resist 108 is deposited over the spacer layer 106, and patterned using a second photomask (not shown) to form additional sacrificial patterns 108 separated by openings 109. The resulting configuration is shown in FIG. 1B.

Figure 1C:
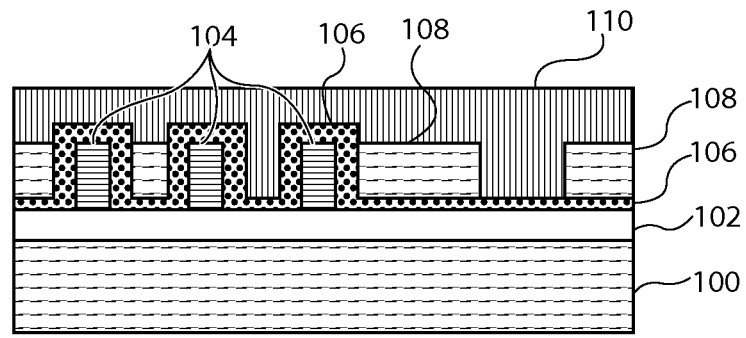

A negative resist, silicon hard mask or ALD oxide layer 110 is deposited over the substrate as shown in FIG. 1C.

Figure 1D:
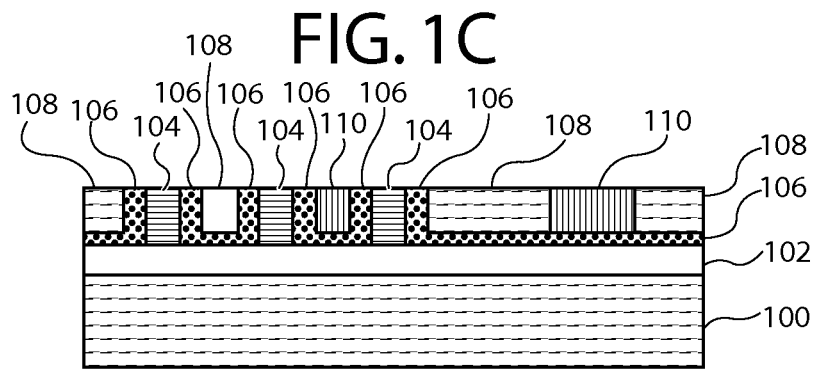

The substrate is then etched back non-selectively, as shown in FIG. 1D.

Figure 1E:
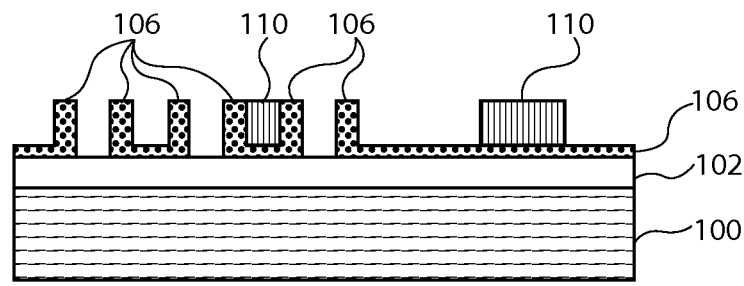

The substrate is selectively etched to remove resist layer 108, as shown in FIG. 1E.

Figure 1F:
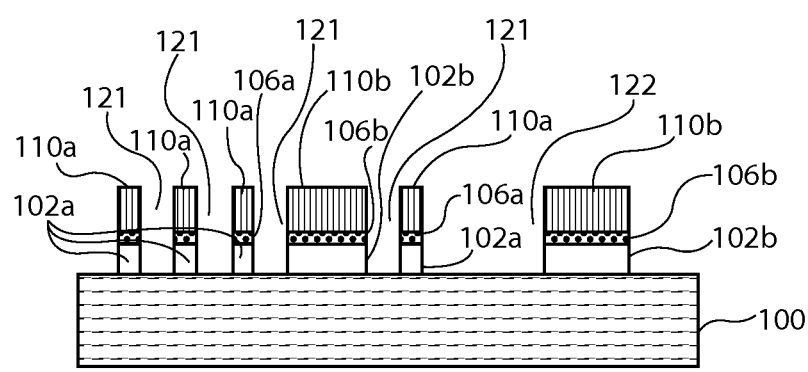

The substrate is then anisotropically etched (e.g., by plasma etch) to remove the middle resist layer 106 and bottom resist layer 102, as shown in FIG. 1F. The substrate now has a plurality of openings 121 to be filled with conductive material (e.g., copper) for forming the "A patterns" and opening 122 to be filled with conductive material (e.g., copper) for forming the "B patterns".

Thus, the first mask and second mask have patterns (lines) with respectively different widths, and the resulting A patterns and B patterns are formed by separate processes and have different widths. This can have an impact on parasitic capacitances. For example, if the A patterns and B patterns are parallel lines with the same center-to-center pitch, the wider B patterns have a lower resistance and greater capacitance (due to the smaller spacing between the B patterns.

Further, because sidewall spacers are used to define patterns, the spacing between the patterns can result in variations in line width.

Figure 2A:
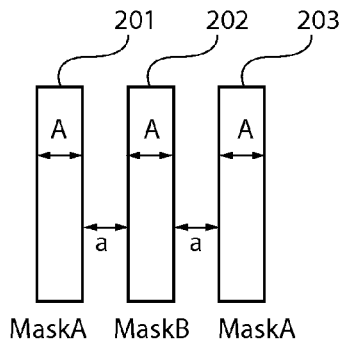
FIG. 2A shows a portion of a layout.
Figure 2B:
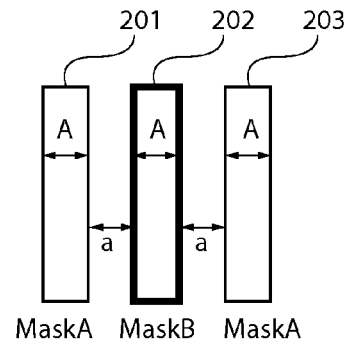
FIG. 2B shows the resulting line widths and spacings for a method in which lines patterned with the second mask (mask B) have different width bias than lines patterned using the first mask (mask A).

FIG. 2A shows a layout having patterns (lines) 201-203 of width A and constant dense spacing a. As used herein, the term "dense spacing" refers to patterns having a separation distance less than two times a minimum separation distance at which two adjacent lines can be clearly patterned using a single mask, single photo process. The pattern 202 has dense spacing a on both its left and right sides, and is thus referred to herein as a "dense-dense" pattern. When this layout is split among two masks (with lines 201, 203 on mask A, and line 202 on mask B), and patterned on a single layer using the two processes, the resulting patterns have the same width A and spacing a. As shown in FIG. 2B, the line width for lines 201-203 patterned by Mask B is the same as for lines patterned using Mask A. In this case, the parasitic capacitive couplings are not affected by the dense-dense spacing.

Figure 3A:
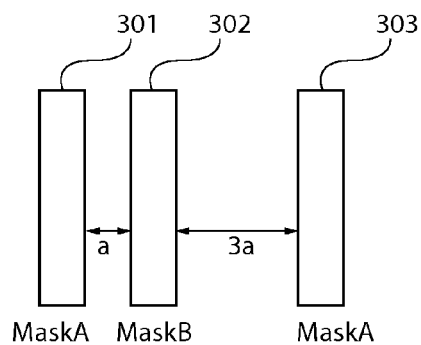
FIG. 3A shows another portion of a layout.
Figure 3B:
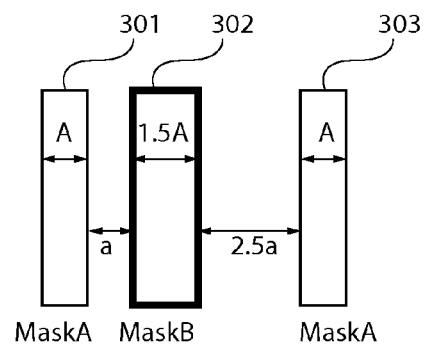
FIG. 3B shows the resulting line widths and spacings for a method in which lines patterned with the second mask (mask B) have different width bias than lines patterned using the first mask (mask A).

FIG. 3A shows a layout having three lines 301-303 of width A. Line 302 has a dense spacing a on its left side and an isolated ("iso") spacing 3a on its right side. As used herein, the term "iso spacing" refers to patterns which are separated by a distance of at least two times a minimum separation distance at which two adjacent lines can be clearly patterned using a single mask, single photo process. The pattern 302 has dense spacing a on its left side and iso spacing on its right side, and is thus referred to herein as a "dense-iso" pattern. When this layout is split among two masks (with lines 301, 303 on mask A, and line 302 on mask B), and patterned on a single layer using the two processes, the resulting line 302 patterned by mask B has a different width 1.5A and different spacing 2.5a between lines 302 and 303. As shown in FIG. 3B, the line width margin for lines 301-303 patterned by Mask B is different from that for lines patterned using Mask A.

Figure 4A:
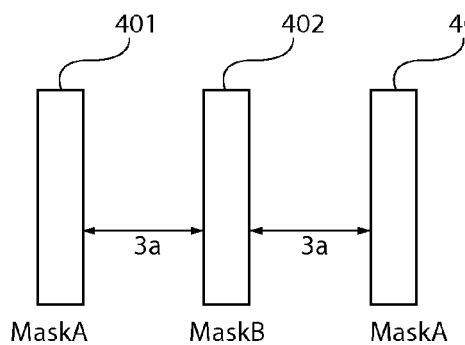
FIG. 4A shows another portion of a layout.
Figure 4B:
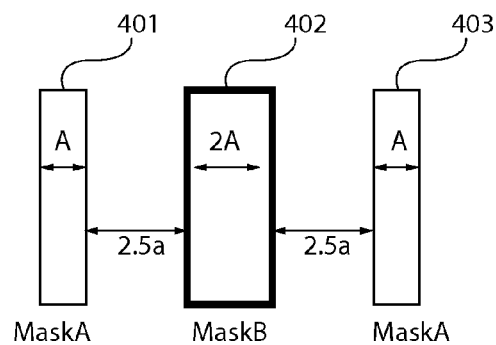
FIG. 4B shows the resulting line widths and spacings for a method in which lines patterned with the second mask (mask B) have different width bias than lines patterned using the first mask (mask A).

FIG. 4A shows a layout having three lines 401-403 of width A. Line 402 has a iso spacing 3a on both sides is thus referred to herein as an "iso-iso" pattern. When this layout is split among two masks (with lines 401, 403 on mask A, and line 402 on mask B), and patterned on a single layer using the two processes, the resulting line 402 patterned by mask B has a different width 2A and different spacing 2.5a on both sides. As shown in FIG. 4B, the line width margin for lines 401-403 patterned by Mask B is different from that for lines patterned using Mask A.

If the layout design of FIG. 2A is used for RC extraction and simulation, the results should correctly predict the parasitic capacitance and resistance in the IC having the patterns of FIG. 2B. However, if the layout design of FIG. 3A or 4A is used for RC extraction and simulation, without accounting for the line width bias of lines patterned by the second (B) mask, then the simulation results will be less accurate. The capacitance between lines becomes larger as spacing between the lines becomes larger. Also, the resistance of the lines becomes smaller as the lines become wider.

Thus, for patterning iso-dense lines (FIGS. 3A, 3B) or iso-iso lines (FIGS. 4A, 4B), the two masks A and B are not equivalent. Given a plurality of polygons (e.g., lines) divided into two groups for patterning on a single layer using two respective masks, parasitic losses resulting if the first group is assigned to the first mask and the second group is assigned to the second mask, can differ from the losses resulting if the first group is assigned to the second mask and the second group is assigned to the first mask. Embodiments of a method and tool are described herein for assessing the parasitic capacitive couplings in both scenarios, enabling the designer to assign patterns to the appropriate masks to achieve the optimal capacitance (C), resistance (R) or RC couplings.

Figure 5:
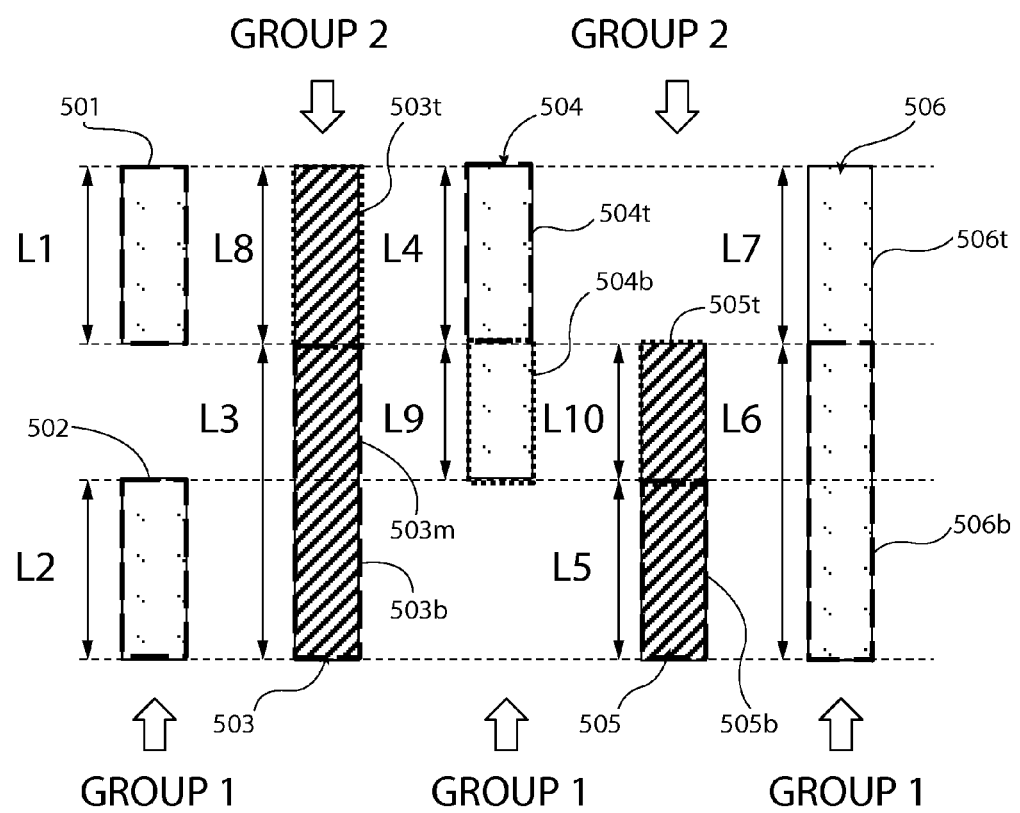
FIG. 5 shows a portion of a layout, on which an embodiment of a method as described herein can be performed.

FIG. 5 shows an example of a layout of a single layer of an integrated circuit to be patterned using two masks. The layout includes a set of polygons (lines) 501-506. The spacings between lines 501 and 503, between 502 and 503, between 503 and 504, between 504 and 505, and between 505 and 506 are all smaller than the minimum separation design rule (e.g., <1.85 times the minimum spacing for clearly patterning two adjacent lines on a single layer using a single mask. Thus, multi-patterning (e.g., double patterning) will be used. Lines 501, 502, 504 and 506 are assigned to a first group, and patterns 503 and 505 are assigned to a second group. As noted above, a determination will be made whether parasitic impacts are minimized by assigning the first group or the second group to the second mask.

For purposes of evaluating capacitance, each line 503-506 can be divided into two or more portions, each portion having a respective spacing relationship to its nearest neighboring lines (where the spacing relationship is either dense-dense, dense-iso, or iso-iso). Thus, lines 501 and 502 are dense-iso patterns, because they are isolated on the left side, and have dense spacing on the right. Line 503 has three portions 503$t$, 503$m$ and 503$b$. The top portion 503$t$ has dense-dense spacing, with nearest neighbors 501 and 504. The middle portion 503$m$ has dense spacing with nearest neighbor 504 and iso spacing on the left side. The bottom portion 503$b$ has dense spacing with neighbor 502 and iso spacing on the right side. Line 504 has two portions 504$t$ and 504$b$. The top portion 504$t$ has dense spacing with neighbor 503 on the left and iso spacing on the right. The bottom portion 504$b$ has dense-dense spacing with neighbors 503 on the left and 505 on the right. Line 505 has two portions 505t and 505b. The top portion 505t has dense spacing with neighbors 504 on the left and 506 on the right. The bottom portion 505b has dense spacing with neighbor 506 on the right and iso spacing on the left. Line 506 has two portions 506t, and 506b. The top portion 506t has iso-iso spacing. The bottom portion 506b has dense spacing with neighboring line 505 on the left and iso spacing on the right.

After analyzing the layout geometry and identifying the spacing relationships for each portion of each line 501-506, a specially programmed processor (described below) computes an RC impact cost function for each of two scenarios: (1) group 1 is assigned to mask A and group 2 is assigned to mask B; and (2) group 1 is assigned to mask B and group 2 is assigned to mask A.

In some embodiments, the specially programmed processor computes a capacitance (C) cost, resistance (R) cost or resistance-capacitance (RC) cost associated with each of the two scenarios (1) and (2). In some embodiments, the specially programmed processor includes one available cost computation, based on either C cost, R cost and RC cost. In some embodiments, the specially programmed processor includes all three computations, and offers the designer (or foundry user) a choice between using C cost, R cost or RC cost as the criterion for determining to which mask group 1 is assigned.

As noted above, if all of the polygons (lines) are dense-dense patterns (e.g., FIGS. 2A, 2B), then the lines formed by mask B have the same width bias as the lines formed by mask A, and the parasitic couplings and loses are the same in scenarios (1) and (2). Thus, the C cost and R cost represent the incremental increase (for dense-iso patterns and/or iso-iso patterns relative to dense-dense spacing.

In some embodiments, the system is programmed to perform capacitance (C) optimization, using the equation:

$$C\text{cost} = \Sigma L_i * \text{Weight\_Cap\_Dense\_Iso} + \Sigma L_j * \text{Weight\_Cap\_Iso\_Iso} \quad (1)$$

where Li is the length of line portion i,

Weight_Cap_Dense_Iso is a weighting factor for dense-iso patterns, determined by simulation. In one non-limiting example (as shown in FIG. 3A, 3B) Weight_Cap_Dense_Iso=1.08, and Weight_Cap_Iso_Iso is a weighting factor for dense-iso patterns, determined by simulation. In one non-limiting example (as shown in FIG. 3A, 3B), Weight_Cap_Iso_Iso=1.21

As noted above, dense-dense patterns have the baseline line width bias, so the dense-dense patterns (or portions of patterns) do not have any cost.

For example, referring again to FIG. 5, the dense-iso portions include 501, 502, 503m, 503b, 504t, 505b and 506b. The iso-iso portions include portion 506.

Equation (1) is computed once with the group 2 patterns (503, 505) assigned to Mask B, so that $$C\text{cost}=(L3+L5)*1.08$$

Then Equation (1) is computed with the group 1 patterns (501, 502, 504, 506) assigned to Mask B, so that:

$$C\text{cost}=(L1+L2+L4+L6)*1.08*+L7*1.21$$

The specially programmed processor then determines which computation of C cost is greater. If the C Cost for assigning Group 1 to Mask B>for assigning Group 2 to mask B, then the system assigns Group 1 to Mask A. Otherwise, Group 2 is assigned to Mask B In some embodiments, the system is programmed to perform resistance (R) optimization. For R optimization, the computer uses the equation:

$$R\text{Cost}=\Sigma l_i*\text{Weight\_Res\_Dense\_Iso}+ \Sigma l_j*\text{Weight\_Res\_Iso\_Iso} \quad (2)$$

where Weight_Res_Dense_Iso is a weighting factor for dense-iso patterns, determined by simulation. In one non-limiting example (as shown in FIG. 3A, 3B), Weight_Res_Dense_Iso=0.65; and Weight_Res_Iso_Iso is a weighting factor for iso-iso patterns, determined by simulation. In one non-limiting example (as shown in FIG. 3A, 3B), Weight_Res_Iso_Iso=0.48

Equation (2) is computed once with the group 2 patterns (503, 505) assigned to Mask B, so that $$R\text{cost}=(L3+L5)*0.65$$

Then Equation (2) is computed with the group 1 patterns (501, 502, 504, 506) assigned to Mask B, so that:

$$R\text{cost}=(L1+L2+L4+L6)*0.65*+L7*0.48$$

The specially programmed processor then determines which computation of R cost is greater. If the R Cost for assigning Group 1 to Mask B>for assigning Group 2 to mask B, then the system assigns Group 1 to Mask A. Otherwise, Group 2 is assigned to Mask B In some embodiments, the system is programmed to perform RC optimization. For RC optimization, the computer uses the equation:

$$RC\text{cost}=\Sigma l_i*\text{Weight\_Cap\_Dense\_Iso}*\text{Weight\_Res\_Dense\_Iso}+ \Sigma l_j*\text{Weight\_Cap\_Iso\_Iso}*\text{Weight\_Res\_Iso\_Iso} \quad (3)$$

Equation (3) is computed once with the group 2 patterns (503, 505) assigned to Mask B, so that $$RC\text{cost}=(L3+L5)*1.08*0.65$$

Then Equation (3) is computed with the group 1 patterns (501, 502, 504, 506) assigned to Mask B, so that:

$$RC\text{cost}=(L1+L2+L4+L6)*1.08*0.65+L7*1.21*0.48$$

Figure 6A:
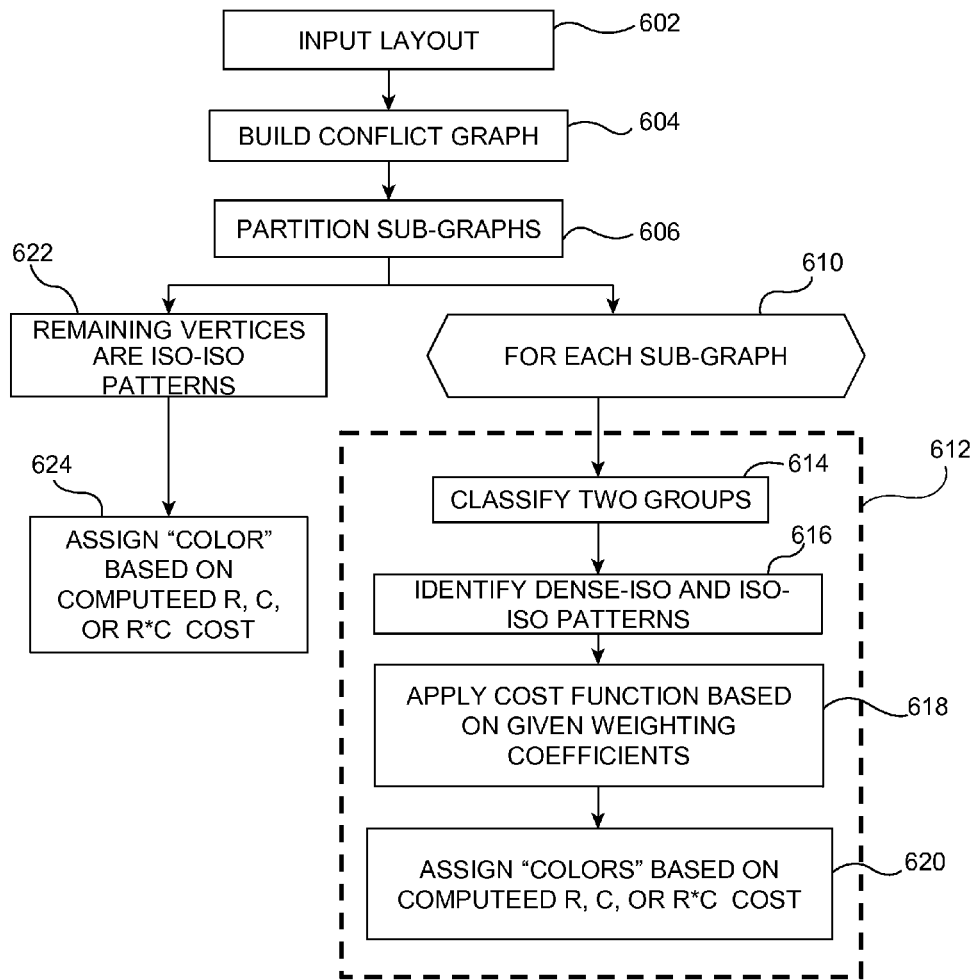
FIG. 6A is a flow chart of an embodiment of a post-layout multi-patterning decomposition method for a process in which lines patterned with the second mask (mask B) have different width bias than lines patterned using the first mask (mask A).

The specially programmed processor then determines which computation of RC cost is greater. If the RC Cost for assigning Group 1 to Mask B>for assigning Group 2 to mask B, then the system assigns Group 1 to Mask A. Otherwise, Group 2 is assigned to Mask B FIG. 6 is a flow chart of an embodiment of a method for layout decomposition/optimization. (i.e., determining which group of patterns should be included on the first mask, and which group of patterns should be included on the second mask. This method can be performed, for example, after the place and route tool has generated a layout. For example, a designer can generate the layout using the place and route tool, and then provide the layout to a foundry.

At step 602, the specially programmed processor inputs the layout. The layout includes the description of each polygon representing a circuit pattern (e.g., conductive line or conductive via) to be formed in a layer of a semiconductor IC. In some embodiments, the patterns of the layout are lines, to be patterned in the layer using a process for which the second mask has a different line width bias than the first mask. In some embodiments, the patterns of the layout are lines, to be patterned in the layer using a process for which a line width of a line formed by the second mask depends on a distance between that line and a nearest adjacent line on each side of that line.

Figure 6B:
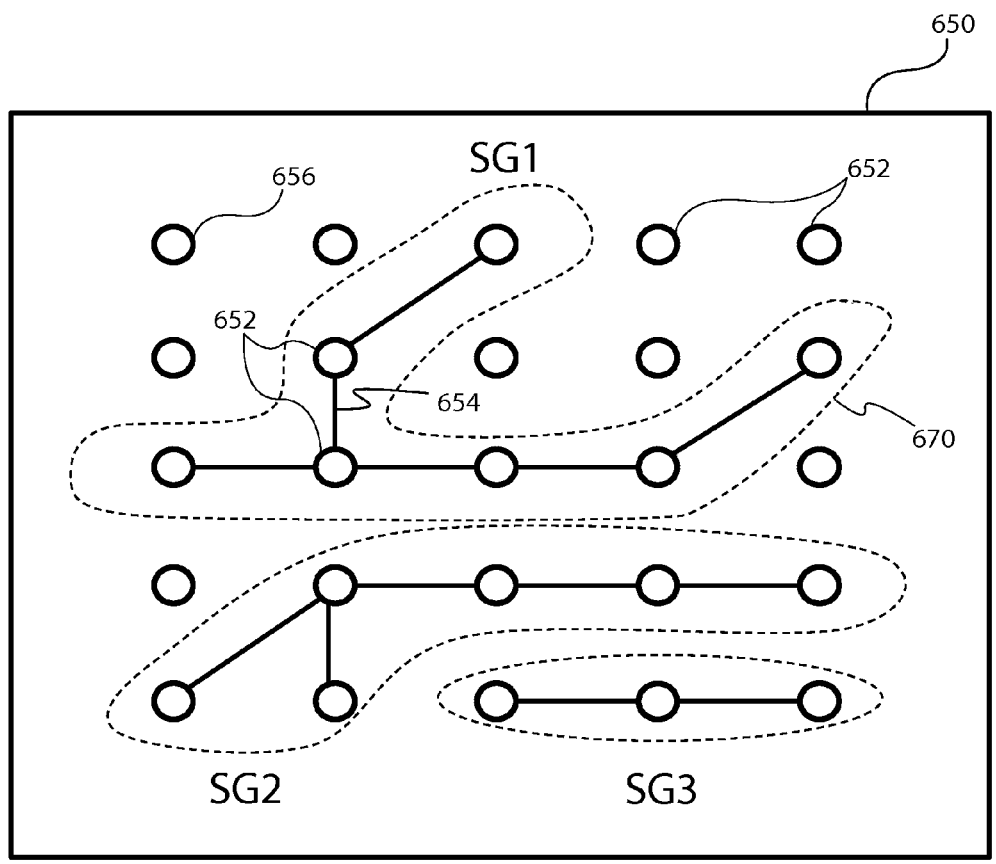
FIG. 6B is a conflict graph of a layout.

At step 604, the tool builds a conflict graph. FIG. 6B shows an example of a conflict graph 650. A conflict graph 650 is a representation of a layout suited for facilitating multi-patterning decomposition The conflict graph 650 represents each polygon (e.g., line) as a vertex 652. The conflict graph 650 includes a respective edge 654 connecting each pair of vertices 652 representing a pair of polygons separated from each other by a spacing smaller than a minimum threshold spacing, where the threshold spacing is determined by a design rule. The threshold is selected so that any pair of polygons (e.g., lines) separated by a distance greater than or equal to the threshold value can be clearly patterned on the same layer by a single mask without using multi-patterning techniques.

At step 606, the conflict graph is partitioned into sub-graphs 670. Each vertex 652 within a given sub-graph 670 is connected to at least one other vertex 652 within the same sub-graph by an edge 654. No vertex 652 is connected by any edge 654 to any vertex 652 of another sub-graph 670. Isolated vertices 656 which have no edges are separated from every other pattern by a sufficient distance that they can be clearly patterned using either mask. The conflict graph 650 is displayed on a display device.

Each sub-graph represents a portion of a layout of a single layer of an integrated circuit to be multi-patterned. The portion of the layout corresponding to the sub-graph has a plurality of patterns representing circuit elements.

At step 610, a loop 612 (including steps 614-620) is performed for each sub-graph. Thus, each sub-graph can be decomposed separately to minimize the C cost, R cost or RC cost of assigning either the first group or the second group of patterns to the second mask.

At step 614, the polygons (vertices) in the sub-graph are divided into two groups (e.g., a first mask and a second mask), each of which can be clearly patterned on a respective single layer by a respectively different one of the first mask or the second mask. For ease of understanding, consider the simple case of double patterning (using two masks) where a sub-graph does not have any closed loop. For any path between two vertices, beginning with the first vertex, the odd numbered vertices are assigned to one group and the even numbered vertices are assigned to the other group. Then none of the vertices will have an edge directly connecting it to another vertex assigned to the same mask.

At step 616, for each respective portion of each one of the plurality of patterns, determining a spacing relationship between that portion of that pattern and any adjacent pattern on either or both sides of that pattern. For example, in some embodiments, the step of determining a spacing relationship comprises classifying each portion of each pattern as either having either dense spacing on both sides, dense spacing on one side and isolated spacing on the other side, or isolated spacing on both sides.

At step 618, the cost function (either equation (1), (2) or (3)) is computed for all of the vertices in the sub-graph. The specially programmed processor computes, a first capacitance (C), resistance (R), or resistance-capacitance (RC) cost of assigning the first group to the first mask and the second group to the second mask, and a second C, R or RC cost of assigning the first group to the second mask and the second group to the first mask. The computing is based on the spacing relationships. This step includes assigning a weight to each spacing relationship, and multiplying the length of each respective portion of each pattern by the weight assigned to the spacing relationship of that portion of that pattern.

At step 620, the "color" is assigned based on the C cost, R cost, or RC cost. That is, the first group of patterns in the sub-graph is specifically assigned to either the first mask or the second group of patterns in the sub-graph is assigned to the other of the first mask or second mask. The processor assigns the first group to the first mask and the second group to the second mask if the first C, R or RC cost is lower than the second C, R or RC cost. The processor assigns the first group to the second mask and the second group to the first mask if the second C, R or RC cost is lower than the first C, R or RC cost.

At step 622, the remaining vertices, which are not included in any of the sub-graphs are classified as iso-iso patterns.

At step 624, the colors (mask assignments) of the remaining iso-iso patterns (corresponding to the isolated vertices 656) are assigned individually based on the computed R, C or RC cost for each remaining pattern. The processor identifies each individual isolated vertex 656 having no edge connection to another vertex in any of the plurality of sub-graphs 670. The isolated vertex 656 represents a pattern having isolated spacing on both sides. In some embodiments, the user selects a criterion from the group consisting of capacitance or resistance. The system evaluates respective costs, based on the selected criterion, of including the pattern corresponding to the isolated vertex in the first mask and of including the pattern in the second mask. The pattern corresponding to the isolated vertex is assigned to the one of the first mask or second mask corresponding to the lower evaluated cost.

In some embodiments, the pattern corresponding to the isolated vertex 656 is assigned to the first mask if the selected criterion is capacitance; and the pattern corresponding to the isolated vertex is assigned to the second mask if the selected criterion is resistance.

Figure 7:
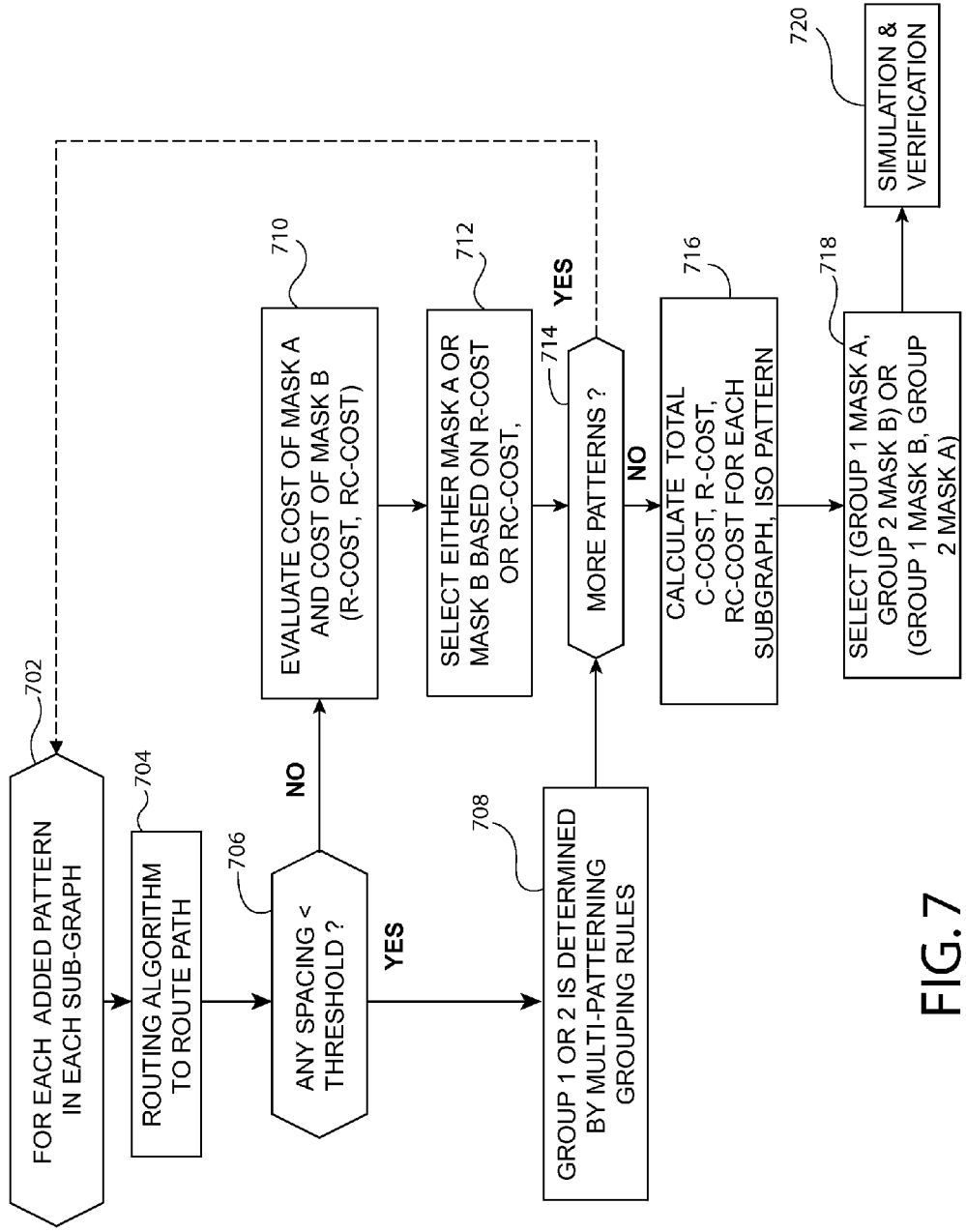
FIG. 7 is a flow chart of an embodiment of a routing and multi-patterning decomposition method for a process in which lines patterned with the second mask (mask B) have different width bias than lines patterned using the first mask (mask A).

FIG. 7 is a flow chart of an embodiment in which the grouping and "coloring" (assignment of each group to a specific mask) are performed by the designer during routing, using the place and route tool, which is modified to include the C, R and RC cost computations.

A portion of a layout of a single layer of an integrated circuit is provided, to be multi-patterned, the portion of the layout having a plurality of patterns representing circuit elements. The patterns are to be divided into at least a first group and a second group. Each of the first and second groups are to be patterned on the single layer by a respectively different one of a first mask or a second mask.

At step 702, a loop is performed for each added pattern in each sub-graph.

At step 704, the place and route tool uses its routing algorithm to route a path between two nodes (e.g., a line connecting two conductive vias).

At step 706, a determination is made whether any spacing between any of the patterns in the path is less than the minimum threshold separation distance. If there are any spacings smaller than the threshold, step 708 is performed. Otherwise, step 710 is performed.

At step 708, if any of the spacings between adjacent patterns in the path is smaller than the threshold, those patterns are included in a sub-graph, and the patterns in the sub-graph are divided into to two groups according to multi-patterning grouping design rules, so that no two patterns within the same group are separated by a spacing smaller than the threshold.

At step 710, if there are no spacings smaller than the threshold, then the added patterns are iso-iso patterns separated from a nearest neighboring pattern by at least a threshold distance. The iso-iso patterns can be assigned to either the first mask or the second mask. The processor computes a R or RC cost of assigning the additional pattern to the first mask, and a second R or RC cost of assigning the additional pattern to the second mask. The computing is based on a respective spacing relationship between each respective portion of the additional pattern and any adjacent pattern on either or both sides of that portion.

At step 712, the iso-iso patterns are assigned to either the first mask or second mask, depending on whether the first R or RC cost is lower than the second R or RC cost.

At step 714, if there are more patterns to be routed, the loop is repeated until all of the patterns are routed, and all of the patterns within each sub-graph are assigned to the first group or second group.

At step 716, the cost function (either equation (1), (2) or (3)) is computed for all of the vertices in the sub-graph. The specially programmed processor computes, a first capacitance (C), resistance (R), or resistance-capacitance (RC) cost of assigning the first group to the first mask and the second group to the second mask, and a second C, R or RC cost of assigning the first group to the second mask and the second group to the first mask. The computing is based on the spacing relationships. This step includes assigning a weight to each spacing relationship, and multiplying the length of each respective portion of each pattern by the weight assigned to the spacing relationship of that portion of that pattern.

At step 718, the "color" is assigned based on the C cost, R cost, or RC cost. That is, the first group of patterns in the sub-graph is specifically assigned to either the first mask or the second mask, and the second group of patterns in the sub-graph is assigned to the other of the first mask or second mask. The processor assigns the first group to the first mask and the second group to the second mask if the first C, R or RC cost is lower than the second C, R or RC cost. The processor assigns the first group to the second mask and the second group to the first mask if the second C, R or RC cost is lower than the first C, R or RC cost.

At step 720, the processor performs RC extraction, simulation and verification.

Figure 8:
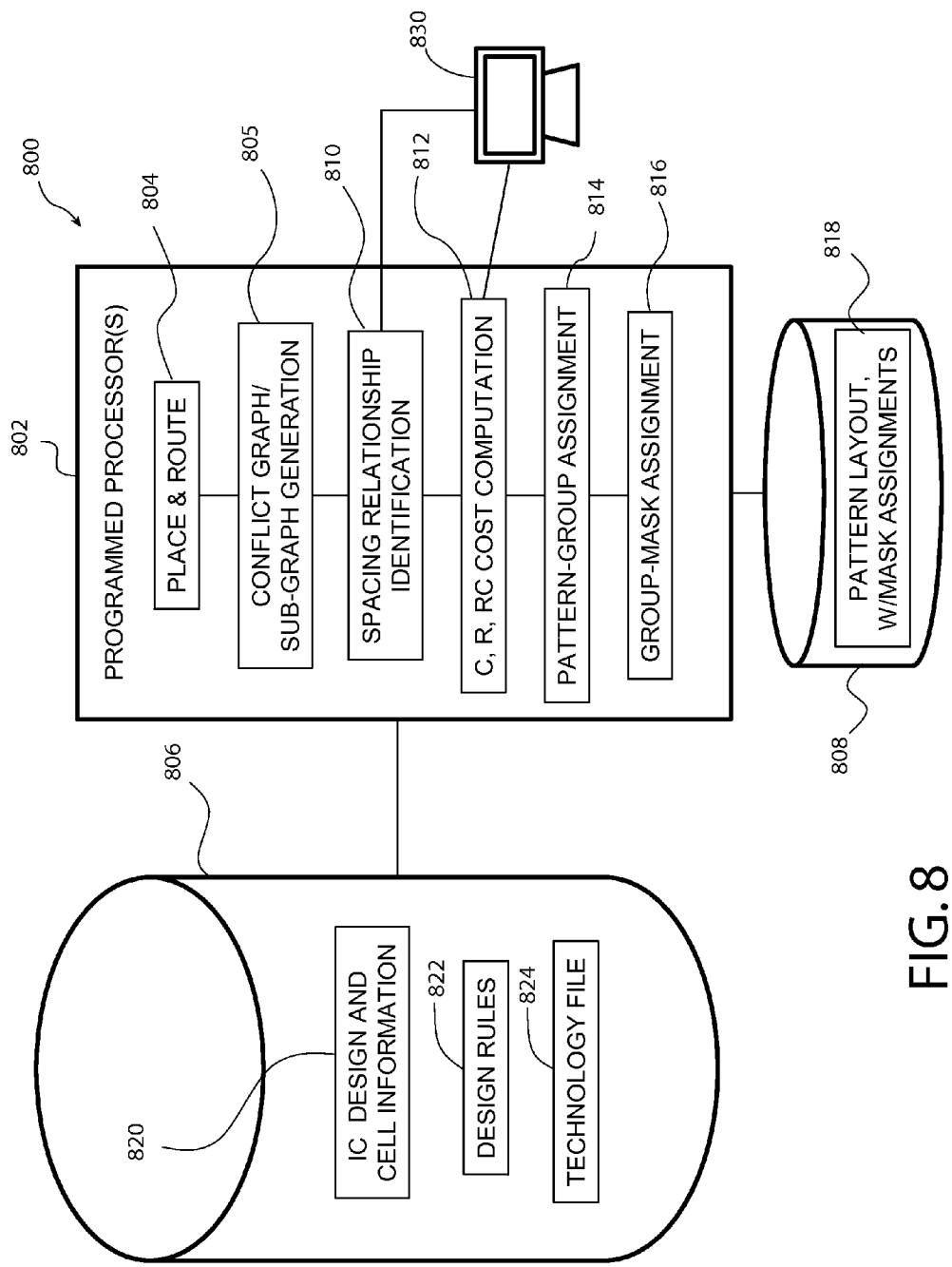
FIG. 8 is a block diagram of an embodiment of a system for performing a method as described herein.

FIG. 8 is a block diagram of a system for performing the method described herein.

FIG. 8 is a block diagram of a system 800 for providing layouts and performing the multi-patterning decomposition for the layer of the substrate, according to one embodiment. Block 802 indicates that one or more programmed processors may be included. In some embodiments, the processing load is performed by two or more application programs, each operating on a separate processor. In other embodiments, the processes are all performed using one processor. Similarly, two media 806 and 808 are shown, but the data may be stored in any number of media. Although FIG. 8 shows an allocation of the various tasks to specific modules, this is only one example. The various tasks may be assigned to different modules to improve performance, or improve the ease of programming.

System 800 includes an electronic design automation ("EDA") tool such as "IC COMPILER"™, sold by Synopsys, Inc. of Mountain View, Calif., which may include a place and route tool 804, such as "ZROUTE"™, also sold by Synopsys. Other EDA tools may be used, such as the "VIRTUOSO" custom design platform or the Cadence "ENCOUNTER"® digital IC design platform may be used, along with the "VIRTUOSO" chip assembly router 804, all sold by Cadence Design Systems, Inc. of San Jose, Calif.

The EDA tool is a special purpose computer formed by retrieving stored program instructions from a non-transient computer readable storage medium 806 and executing the instructions on a general purpose processor 802. Thus, the instructions configure the logic circuits of the processor 802 to function as an EDA tool. Examples of non-transient computer readable storage mediums 806, 808 include, but are not limited to, hard disk drives (HDD), read only memories ("ROMs"), random access memories ("RAMs"), flash memories, or the like. Tangible, non-transient machine readable storage mediums 806, 808 are configured to store data generated by the place and route tool 804.

The router of the place and route tool 804 is capable of receiving an identification of a plurality of cells to be included in an integrated circuit ("IC") or interposer layout, including a netlist 820 containing pairs of cells within the plurality of cells to be connected to each other. Router 804 may be equipped with a set of default design rules 822 and technology file 824. For performing the method described above, the technology file 824 is modified to include the resistance and capacitance weight factors described above with reference to equations (1) and (2).

A graphical interface facilitates the design process by displaying conflict graphs and sub-graphs, such as those described above with reference to FIG. 6B. In some embodiments, a display 830 displays a graphical representation of the layout graph, and assists the user in the decomposition and mask assignment decisions.

A module 810 performs spacing relationship identification. For example, in some embodiments, the spacing relationships are classified as either dense-dense, dense-iso, or iso-iso. In other embodiments, more complex spacing relationship classification having a different number of categories can be used, to improve accuracy.

A cost computation module 812 computes the cost of assigning a group of patterns within a sub-graph or graph to a particular mask used in a particular process. In some embodiments, the cost computation module 812 computes a capacitance cost. In some embodiments, the cost computation module 812 computes a resistance cost. In some embodiments, the cost computation module 812 computes a resistance-capacitance cost. In some embodiments, the cost computation module 812 is capable of computing C, R and RC costs, and allows the user to select any one of the three criteria.

A pattern group assignment module assigns the individual patterns within a sub-graph to either the first group or the second group of patterns, such that within each group, no two patterns are separated from each other by less than the minimum separation threshold design rule.

A pattern group assignment module 816 assigns each group within each sub-graph to either the first mask or second mask, and assigns the remaining iso-iso patterns to either the first mask or second mask, based on the cost computations.

The pattern layout with mask assignments 818 are then stored in a non-transitory machine-readable storage medium 808.

The system and method described herein can be adapted to apply the capacitance, resistance or RC cost function for mask assignments either during the routing process, or after layout generation. The system and method can be applied for any multi-patterning process where lines patterned using two or more masks have different line width biases.

In some embodiments, a method comprises providing a portion of a layout of a single layer of an integrated circuit to be multi-patterned, the portion of the layout having a plurality of patterns representing circuit elements, the patterns divided into at least a first group and a second group, each of the first and second groups to be patterned on the single layer by a respectively different one of a first mask or a second mask. For each respective portion of each one of the plurality of patterns, a spacing relationship is determined, between that portion of that pattern and any adjacent pattern on either or both sides of that pattern. A processor computes a first capacitance (C), resistance (R), or resistance-capacitance (RC) cost of assigning the first group to the first mask and the second group to the second mask, and a second C, R or RC cost of assigning the first group to the second mask and the second group to the first mask. The computing is based on the spacing relationships. The processor assigns the first group to the first mask and the second group to the second mask if the first C, R or RC cost is lower than the second C, R or RC cost.

Some embodiments further comprise assigning, by the processor, the first group to the second mask and the second group to the first mask if the second C, R or RC cost is lower than the first C, R or RC cost.

In some embodiments, the step of determining a spacing relationship comprises classifying each portion of each pattern as either having either dense spacing on both sides, dense spacing on one side and isolated spacing on the other side, or isolated spacing on both sides.

In some embodiments, the computing step includes assigning a weight to each spacing relationship, and multiplying the length of each respective portion of each pattern by the weight assigned to the spacing relationship of that portion of that pattern.

In some embodiments, the patterns of the layout are lines, to be patterned in the layer using a process for which the second mask has a different line width bias than the first mask.

In some embodiments, the patterns of the layout are lines, to be patterned in the layer using a process for which a line width of a line formed by the second mask depends on a distance between that line and a nearest adjacent line on each side of that line.

In some embodiments, the second mask is to be formed by spacers in the layer of the substrate, the spacers to be formed on side walls of lines to be patterned by the first mask.

Some embodiments further comprise generating a conflict graph representing the layout, the conflict graph having a respective vertex corresponding to each respective pattern and an edge connecting each pair of vertices corresponding to a respective pair of patterns separated from each other by a spacing smaller than a threshold distance; partitioning the graph into a plurality of sub-graphs, such that each vertex in each sub-graph is connected to at least one other vertex in the same sub-graph, and is unconnected to any vertex in any other sub-graph, one of the sub-graphs corresponding to the plurality of patterns.

Some embodiments further comprise identifying at least one isolated vertex having no edge connection to another vertex in any of the plurality of sub-graphs, the isolated vertex representing a pattern having isolated spacing on both sides; selecting a criterion from the group consisting of capacitance or resistance; evaluating respective costs, based on the selected criterion, of including the pattern corresponding to the isolated vertex in the first mask and of including the pattern in the second mask; and assigning the pattern corresponding to the isolated vertex to the one of the first mask or second mask corresponding to the lower evaluated cost.

In some embodiments, the patterns of the layout are lines, to be patterned in the layer using a process for which the second mask has a different line width bias than the first mask; the pattern corresponding to the isolated vertex is assigned to the first mask if the selected criterion is capacitance; and the pattern corresponding to the isolated vertex is assigned to the second mask if the selected criterion is resistance.

In some embodiments, a routing method comprises providing a portion of a layout of a single layer of an integrated circuit to be multi-patterned, the portion of the layout having a plurality of patterns representing circuit elements, the patterns divided into at least a first group and a second group, each of the first and second groups to be patterned on the single layer by a respectively different one of a first mask or a second mask. An additional pattern of the layout, separated from a nearest neighboring pattern by at least a threshold distance is identified. A processor computes a first resistance (R) or resistance-capacitance (RC) cost of assigning the additional pattern to the first mask, and a second R or RC cost of assigning the additional pattern to the second mask, the computing based on a respective spacing relationship between each respective portion of the additional pattern and any adjacent pattern on either or both sides of that portion. The additional pattern is assigned to either the first mask or the second mask, depending on whether the first R or RC cost is lower than the second R or RC cost.

Some embodiments further comprise computing, in the processor, a first capacitance (C), R, or RC cost of assigning the first group to the first mask and the second group to the second mask, and a second C, R or RC cost of assigning the first group to the second mask and the second group to the first mask, the computing based on a respective spacing relationship between each respective portion of each pattern and any adjacent pattern on either or both sides of that portion; and assigning, by the processor, the first group to the first mask and the second group to the second mask if the first C, R or RC cost is lower than the second C, R or RC cost.

Some embodiments further comprise assigning, by the processor, the first group to the second mask and the second group to the first mask if the second C, R or RC cost is lower than the first C, R or RC cost.

In some embodiments, the spacing relationship is determined by classifying each portion of each pattern as either having either dense spacing on both sides, dense spacing on one side and isolated spacing on the other side, or isolated spacing on both sides.

In some embodiments, the computing step includes assigning a weight to each spacing relationship, and multiplying the length of each respective portion of each pattern by the weight assigned to the spacing relationship of that portion of that pattern.

In some embodiments, the patterns of the layout are lines, to be patterned in the layer using a process for which the second mask has a different line width bias than the first mask.

In some embodiments, a system comprises a non-transitory, machine readable storage medium encoded with data representing a portion of a layout of a single layer of an integrated circuit to be multi-patterned, the portion of the layout having a plurality of patterns representing circuit elements, the patterns divided into at least a first group and a second group, each of the first and second groups to be patterned on the single layer by a respectively different one of a first mask or a second mask. A processor is coupled to access the storage medium, the processor programmed to perform a method comprising: for each respective portion of each one of the plurality of patterns, determining a spacing relationship between that portion of that pattern and any adjacent pattern on either or both sides of that pattern; computing, in a processor, a first capacitance (C), resistance (R), or resistance-capacitance (RC) cost of assigning the first group to the first mask and the second group to the second mask, and a second C, R or RC cost of assigning the first group to the second mask and the second group to the first mask, the computing based on the spacing relationships; and assigning, by the processor, the first group to the first mask and the second group to the second mask if the first C, R or RC cost is lower than the second C, R or RC cost.

In some embodiments, the method further comprises assigning, by the processor, the first group to the second mask and the second group to the first mask if the second C, R or RC cost is lower than the first C, R or RC cost.

In some embodiments, the step of determining a spacing relationship comprises classifying each portion of each pattern as either having either dense spacing on both sides, dense spacing on one side and isolated spacing on the other side, or isolated spacing on both sides.

In some embodiments, the patterns of the layout are lines, to be patterned in the layer using a process for which the second mask has a different line width bias than the first mask. The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method, comprising:
providing a portion of a layout of a single layer of an integrated circuit to be multi-patterned, the portion of the layout having a plurality of patterns representing circuit elements, the patterns including lines and divided into at least a first group and a second group, each of the first and second groups to be patterned on the single layer by a respectively different one of a first mask in a first process or a second mask in a second process, wherein a line width bias of the second process is different from a line width bias of the first process;
for each respective portion of each one of the plurality of patterns, determining a spacing relationship between that portion of that pattern and any adjacent pattern on either or both sides of that pattern;
computing, in a processor, a first capacitance (C), resistance (R), or resistance-capacitance (RC) cost of assigning the first group to the first mask and the second group to the second mask, and a second C, R or RC cost of assigning the first group to the second mask and the second group to the first mask, the computing based on the spacing relationships;
assigning, by the processor, the first group to the first mask and the second group to the second mask if the first C, R or RC cost is lower than the second C, R or RC cost, and
assigning, by the processor, the first group to the second mask and the second group to the first mask if the first C, R or RC cost is higher than the second C, R or RC cost.

2. The method of claim 1, further comprising assigning, by the processor, the first group to the second mask and the second group to the first mask if the second C, R or RC cost is lower than the first C, R or RC cost.

3. The method of claim 1, wherein the step of determining a spacing relationship comprises classifying each portion of each pattern as either having either dense spacing on both sides, dense spacing on one side and isolated spacing on the other side, or isolated spacing on both sides.

4. The method of claim 3, wherein the computing step includes assigning a weight to each spacing relationship, and multiplying the length of each respective portion of each pattern by the weight assigned to the spacing relationship of that portion of that pattern.

5. The method of claim 4, wherein a weight assigned to a pattern having isolated spacing on both sides is greater than a weight assigned to a pattern having dense spacing on one side thereof and isolated spacing on an opposite side thereof.

6. The method of claim 3, wherein the computing includes assigning a cost of zero for each pattern having dense spacing on both sides that is assigned to the second mask.

7. The method of claim 1, wherein the patterns of the layout are lines, to be patterned in the layer using a process for which a line width of a line formed by the second mask depends on a distance between that line and a nearest adjacent line on each side of that line.

8. The method of claim 1, wherein the second mask is to be formed by spacers in the layer of the substrate, the spacers to be formed on side walls of lines to be patterned by the first mask.

9. The method of claim 1, further comprising:
generating a conflict graph representing the layout, the conflict graph having a respective vertex corresponding to each respective pattern and an edge connecting each pair of vertices corresponding to a respective pair of patterns separated from each other by a spacing smaller than a threshold distance;
partitioning the graph into a plurality of sub-graphs, such that each vertex in each sub-graph is connected to at least one other vertex in the same sub-graph, and is unconnected to any vertex in any other sub-graph, one of the sub-graphs corresponding to the plurality of patterns.

10. The method of claim 9, further comprising:
identifying at least one isolated vertex having no edge connection to another vertex in any of the plurality of sub-graphs, the isolated vertex representing a pattern having isolated spacing on both sides;
selecting a criterion from the group consisting of capacitance or resistance;
evaluating respective costs, based on the selected criterion, of including the pattern corresponding to the isolated vertex in the first mask and of including the pattern in the second mask; and
assigning the pattern corresponding to the isolated vertex to the one of the first mask or second mask corresponding to the lower evaluated cost.

11. The method of claim 10, wherein:
the patterns of the layout are lines, to be patterned in the layer using a process for which the second mask has a different line width bias than the first mask;
the pattern corresponding to the isolated vertex is assigned to the first mask if the selected criterion is capacitance; and
the pattern corresponding to the isolated vertex is assigned to the second mask if the selected criterion is resistance.

12. A routing method, comprising:
providing a portion of a layout of a single layer of an integrated circuit to be multi-patterned, the portion of the layout having a plurality of patterns representing circuit elements, the patterns including lines and divided into at least a first group and a second group, the first group to be patterned on the single layer by a first mask in a first process, the second group to be patterned on the single layer by a second mask in a second process, wherein a line width bias of the second process is different from a line width bias of the first process;

identifying an additional pattern of the layout separated from a nearest neighboring one of the plurality of patterns by at least a threshold distance;

computing, in a processor, a first resistance (R) or resistance-capacitance (RC) cost of assigning the additional pattern to the first mask, and a second R or RC cost of assigning the additional pattern to the second mask, the computing based on a respective spacing relationship between each respective portion of the additional pattern and any adjacent pattern within the plurality of patterns on either or both sides of that portion;

assigning the additional pattern to the first mask if the first R or RC cost is lower than the second R or RC cost, and assigning the additional pattern to the second mask if the second R or RC cost is lower than the first R or RC cost.

13. The method of claim 12, further comprising:

computing, in the processor, a first capacitance (C), R, or RC cost of assigning the first group to the first mask and the second group to the second mask, and a second C, R or RC cost of assigning the first group to the second mask and the second group to the first mask, the computing based on a respective spacing relationship between each respective portion of each pattern and any adjacent pattern on either or both sides of that portion; and assigning, by the processor, the first group to the first mask and the second group to the second mask if the first C, R or RC cost is lower than the second C, R or RC cost.

14. The method of claim 13, further comprising assigning, by the processor, the first group to the second mask and the second group to the first mask if the second C, R or RC cost is lower than the first C, R or RC cost.

15. The method of claim 12, wherein the spacing relationship is determined by classifying each portion of each pattern as either having either dense spacing on both sides, dense spacing on one side and isolated spacing on the other side, or isolated spacing on both sides.

16. The method of claim 12, wherein the computing step includes assigning a weight to each spacing relationship, and multiplying the length of each respective portion of each pattern by the weight assigned to the spacing relationship of that portion of that pattern.

17. A system, comprising:

a non-transitory, machine readable storage medium encoded with data representing a portion of a layout of a single layer of an integrated circuit to be multi-patterned, the portion of the layout having a plurality of patterns representing circuit elements, the patterns including lines and divided into at least a first group and a second group, each of the first and second groups to be patterned on the single layer by a respectively different one of a first mask in a first process or a second mask in a second process, wherein a line width bias of the second process is different from a line width bias of the first process; and a processor coupled to access the storage medium, the processor programmed to perform a method comprising:

for each respective portion of each one of the plurality of patterns, determining a spacing relationship between that portion of that pattern and any adjacent pattern on either or both sides of that pattern;

computing, in a processor, a first capacitance (C), resistance (R), or resistance-capacitance (RC) cost of assigning the first group to the first mask and the second group to the second mask, and a second C, R or RC cost of assigning the first group to the second mask and the second group to the first mask, the computing based on the spacing relationships;

assigning, by the processor, the first group to the first mask and the second group to the second mask if the first C, R or RC cost is lower than the second C, R or RC cost, and assigning, by the processor, the first group to the second mask and the second group to the first mask if the first C, R or RC cost is higher than the second C, R or RC cost.

18. The system of claim 17, wherein the method further comprises assigning, by the processor, the first group to the second mask and the second group to the first mask if the second C, R or RC cost is lower than the first C, R or RC cost.

19. The system of claim 17, wherein the step of determining a spacing relationship comprises classifying each portion of each pattern as either having either dense spacing on both sides, dense spacing on one side and isolated spacing on the other side, or isolated spacing on both sides.

20. The system of claim 19, wherein the computing includes assigning a cost of zero for each pattern having dense spacing on both sides that is assigned to the second mask, and a weight assigned to a pattern having isolated spacing on both sides is greater than a weight assigned to a pattern having dense spacing on one side thereof and isolated spacing on an opposite side thereof.

* * * * *